(12) United States Patent
Schwab et al.

(10) Patent No.: US 11,314,331 B2
(45) Date of Patent: Apr. 26, 2022

(54) OPERATING UNIT FOR A DEVICE, IN PARTICULAR FOR A VEHICLE COMPONENT

(71) Applicant: Behr-Hella Thermocontrol GmbH, Stuttgart (DE)

(72) Inventors: Tobias Schwab, Lippstadt (DE); Harri Pankratz, Lippstadt (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 495 days.

(21) Appl. No.: 16/330,555

(22) PCT Filed: Aug. 23, 2017

(86) PCT No.: PCT/EP2017/071241
§ 371 (c)(1),
(2) Date: Mar. 5, 2019

(87) PCT Pub. No.: WO2018/046302
PCT Pub. Date: Mar. 15, 2018

(65) Prior Publication Data
US 2021/0286430 A1   Sep. 16, 2021

(30) Foreign Application Priority Data

Sep. 9, 2016   (DE) .................... 10 2016 116 970.6

(51) Int. Cl.
*G06F 3/01* (2006.01)
*B60K 37/06* (2006.01)
*G06F 3/041* (2006.01)

(52) U.S. Cl.
CPC .............. *G06F 3/016* (2013.01); *B60K 37/06* (2013.01); *G06F 3/041* (2013.01); *B60K 2370/1438* (2019.05); *B60K 2370/34* (2019.05)

(58) Field of Classification Search
None
See application file for complete search history.

(56) References Cited

U.S. PATENT DOCUMENTS 6,822,635 B2   11/2004   Shahoian et al.
2004/0075676 A1   4/2004   Rosenberg et al.
(Continued)

FOREIGN PATENT DOCUMENTS

DE   10 2005 038 161 A1   7/2006
DE   20 2014 105 258 U1   12/2014

OTHER PUBLICATIONS

International Search Report and Written Opinion for corresponding Patent Application No. PCT/EP2017/071241 dated Oct. 24, 2017.

*Primary Examiner* — Matthew Yeung
(74) *Attorney, Agent, or Firm* — Renner, Otto, Boisselle & Sklar LLP

(57) ABSTRACT

The operating unit for a device, in particular for a vehicle component, is provided with a housing (10) that has a control panel (12) and is provided for attaching in an apparatus, in particular a vehicle dashboard or vehicle center console, the control panel (12) being elastically mounted on the housing (10). Furthermore provided is an actuator (16) for mechanically exciting exclusively the control panel (12) when use of the control panel (12) is detected, the control panel forming the front side of a touch-sensitive touch panel (13). Finally, the operating unit also comprises a vibration compensation mass (20) that is mechanically excitable by the or by an actuator (16) when use of the control panel (12) is detected and is elastically mounted in and/or on the housing (10) and is movable to essentially compensate for a movement of the housing (10) when activating the actuator (16) that can mechanically excite the control panel (12). The operating unit has a backlit display (17) that has a display unit (32) and a backlight unit (34) separate therefrom. The (Continued)

backlight unit (34) or the display unit (32) can operate individually or together as vibration compensation masses (20).

17 Claims, 5 Drawing Sheets

(56) References Cited

U.S. PATENT DOCUMENTS

| | | | | |
|---|---|---|---|---|
| 2008/0055277 | A1* | 3/2008 | Takenaka | G06F 3/0488 |
| | | | | 345/177 |
| 2011/0276878 | A1* | 11/2011 | Sormunen | G06F 3/03547 |
| | | | | 715/702 |
| 2013/0127767 | A1 | 5/2013 | Sorvisto et al. | |
| 2014/0226089 | A1* | 8/2014 | Guard | G06F 3/0412 |
| | | | | 349/12 |
| 2015/0175172 | A1* | 6/2015 | Truong | G10L 25/48 |
| | | | | 701/36 |

\* cited by examiner

OPERATING UNIT FOR A DEVICE, IN PARTICULAR FOR A VEHICLE COMPONENT

The present patent application claims the priority of national German patent application 10 2016 116 970.6, dated 9 Sep. 2016, the content of which hereby belongs to the subject matter of the present PCT application by reference.

The invention relates to an operating unit for a device, the device being in particular a vehicle component. The invention particularly relates to operating units having active haptic feedback with force compensation so that vibrations that occur in the operating unit due to the active haptic feedback are compensated or at least damped.

Display assemblies in motor vehicles are often equipped with active haptic feedback (force feedback). Triggering the feedback on a control panel having a non-negligible mass should not produce any impermissible dynamic force transfer to the vehicle, since, depending on the installation situation, this can lead to parasitic noise or vibrations in the motor vehicle.

Moreover, the haptic feedback should be largely independent of the elasticity of the attachment in the vehicle.

A device equipped with active haptic feedback essentially comprises an control panel (e.g. display), which is elastically mounted to the device housing via a spring system, and an actuator for moving the control panel. FIG. 2 illustrates the forces at work in such a device structure.

For producing the haptic feedback, the display is displaced from its resting position by a specific path $x_1(t)$. The display acceleration $a_1(t)$ may take on values of more than 30 m/s$^2$, which, given a moved display mass $m_1$ of greater than 0.5 kg and a housing mass $m_2$ that typically is low, leads to a non-negligible dynamic force $F_2(t)$ on the device attachment in the vehicle.

If the device mounting or attachment is stiff (stiff spring system $c_2$, $d_2$), this temporally rapidly changeable force may cause impermissible noises or vibrations in the vehicle.

If the attachment is soft (soft spring system $c_2$, $d_2$), on the other hand, it is difficult to maintain installation tolerances for the device in the vehicle. Moreover, in some circumstances it is not possible to adjust the required actuator force curve $F_{Akt}(t)$ using the presence of an additional degree of freedom, specifically the housing movement $x_2(t)$, and thus also additional natural frequencies in the system.

Known from U.S. Pat. No. 6,822,635 is a portable computer, in particular a laptop computer, the input pad of which is provided with haptic feedback. DE-U-20 2014 105 258 describes an example for embodying a touchpad.

To minimize forces acting on the operating unit during haptic feedback and, therefore, acting through the operating unit on the surroundings, it is known to mechanically excite, not the entire touch-sensitive display, but only a part thereof, which part in particular should have a low weight. In this regard, DEA-10 2005 038 161 describes using an input device to mechanically excite merely the touch panel, which is disposed above the actual display. The touch panel and the display are in this respect embodied as separate units. However, the forces resulting during mechanical excitation of the touch panel also cause disturbances and may lead to noise development and may mechanically excite the surroundings of the operating unit, which is not desired.

The object of the invention is to provide a design for an operating unit having active haptic feedback, which design is improved with respect to the development of parasitic noises and vibrations.

To attain this object, according to a first variant the invention suggests an operating unit for a device, e.g. for a vehicle component, in particular a man-machine interface (MMI or HMI), the operating unit being provided with:
- a housing that has a control panel and that is provided for attaching in an apparatus, in particular a vehicle dashboard or vehicle center console,
- wherein the control panel is mounted elastically at and/or in the housing
- at least one actuator for mechanically exciting the control panel when operation of the control panel is detected, and,
- a display unit having a display surface,
- the control panel forming the front side of a touch-sensitive touch panel for detecting, in a spatially resolved manner, a touch of the control panel,
- wherein the touch panel is arranged separated from the display unit, and
- wherein the at least one actuator mechanically excites the touch panel when touching of the control panel is detected,
- a compensation weight that is elastically mounted in and/or at the housing and/or is elastically mounted at the touch panel, wherein the compensation weight is mechanically excitable by the above-mentioned actuator or by an actuator for compensating the forces acting on the housing when the touch panel is mechanically excited (i.e. for essentially suppressing a movement of the housing due to the activation of the actuator mechanically exciting the touch panel),
- wherein
  - the display unit forms the compensation weight
- and/or
  - the display unit has a backlight unit for backlighting the display unit, wherein the backlight unit is arranged separated from the display unit and forms the compensation weight.

According to the first variant of the invention, the force feedback is realized using mechanical excitation solely of the touch panel. The touch panel forms the spatially resolved touch-sensitive control panel of the display unit arranged in front of the display surface. According to the invention, the touch panel is therefore arranged separated from the display unit and movable relative thereto. Furthermore, the touch panel, even in larger surface area displays is itself relatively light in weight, so that the vibrations acting on the housing that inevitably develop during the mechanical excitation of the touch panel are relatively minor.

To further reduce the effects of the mechanical excitation of the touch panel on the housing and on the apparatus in which or on which the housing is arranged, according to this second variant of the invention it is suggested that when the touch panel is excited a compensation weight be excited, specifically phase-shifted, so that movements of the housing due to the activation of the actuator mechanically exciting the touch panel are essentially suppressed. The invention furthermore provides that for the compensation weight a component of the operating unit is used that is required independent of the compensation weight function as a component of the operating unit. In this case, for instance, consideration could be given to the display unit itself or to a backlight unit for the display unit or both.

The display unit essentially sees to selectively letting through or blocking incident light and/or backlighting light. The display unit is typically embodied as an LCD display. The backlight unit has the light sources, and also, as a rule, but not necessarily, a diffusor for homogenizing diffusion of the backlighting light. If both units, that is, display unit and backlight unit, are used for compensation weight, their phase-shifted movement relative to the mechanically excited touch panel is possible due to the fact that the touch panel and the combination of display unit and backlight unit are separated components that are separated from one another, for example, by a light gap (gap-like interval). If only one of the components, display unit or backlight unit, is to act as compensation weight, then backlight unit and display unit must be embodied separately from one another and one of these two units must be mechanically excitable phase-shifted to the touch panel. If the backlight unit does not have any diffuser properties, the diffuser is usefully disposed, in particular fixed, between the backlight unit and the display unit, e.g. on the back of the display unit.

In one advantageous refinement of the invention and typically it is provided that the touch panel has a protective layer made, in particular, of tempered glass, and a sensor layer that works for example in a resistive, capacitive, or optical manner, and has a light-permeable antireflection layer therebetween, these being bonded to one another. The antireflection layer may be embodied, for example, as a polarization filter and especially as a linear or circular polarization filter.

It is in particular advantageous when the compensation weight is movable essentially 180°, phase-shifted, to the excitation movement of the touch panel, wherein the movement stroke of the compensation weight is selected taking into consideration at least the ratio of the mass of the touch panel to the mass of the compensation weight.

In one advantageous embodiment of the invention, it may be provided that the compensation weight is excitable vectorially opposite to the display unit. It may furthermore be advantageous if the movement strokes of touch panel and compensation weight when excited by the actuator or actuators are designed as a function of the ratio of the specific masses of display unit and backlight unit and/or the relationship between the position of the centers of mass of the touch panel and compensation weight and/or the spring damping elements of the specific elastic bearings of touch panel and compensation weight on the housing and/or the size of the movement stroke components or movement strokes, vectorially opposing one another, of touch panel and compensation weight.

In another advantageous embodiment of the invention, it may be provided that a common actuator for moving both the touch panel and the compensation weight is provided, wherein the actuator has a actuator element, the length of which may be changed and which has two ends facing away from one another, it being possible to change the distance between them by opposing movement, and of which the one end is mechanically linked to the touch panel and the other end is mechanically linked to the compensation weight for the purpose of mechanically exciting these two components.

According to the invention, it may be provided that the actuator or actuators work electromechanically or piezoelectrically.

The invention is explained in greater detail in the following using a plurality of exemplary embodiments and referencing the drawings.

FIG. 1 illustrates a first exemplary embodiment of the invention in which the touch panel of a touch screen is embodied separate from the display and movable relative thereto;

FIG. 2 schematically illustrates the forces occurring in an operating unit with active haptic feedback;

FIG. 3 schematically illustrates the forces occurring during inventive use of a counterweight as compensation mass;

FIG. 4 schematically illustrates one design of a haptic feedback, having no counterforce, in an operating unit;

Figure 1:
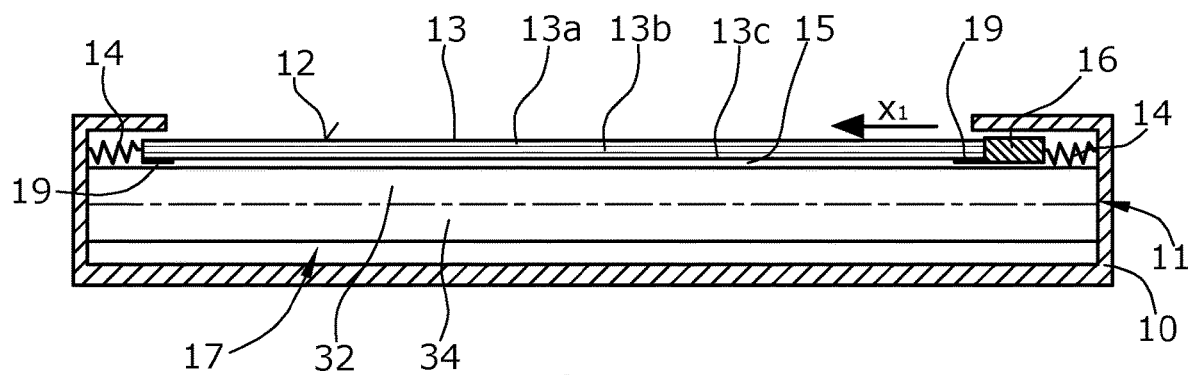

FIG. 1 illustrates a first exemplary embodiment of an inventive operating unit. The operating unit has a housing 10 in which a touch screen 11 with a control panel 12 is arranged. The touch screen 11 has a touch-sensitive touch panel 13 that is arranged separated from the display 17 by an air gap 15. The touch panel 13 is elastically connected to the housing 10 at 14 so that it is movable laterally or such that it has a lateral movement component. In order to produce the haptic force feedback upon an effective actuation (touching of the touch panel and slight pressure thereon), the touch panel 13 may be mechanically excited by means of an actuator 16 that works, for example, piezoelectrically or electromechanically. One or a plurality of path sensors 19 detect a downward pressure on the touch panel 13 and thus effective actuation of the operating unit (force sense). This elastic mounting of the touch panel 13 in the vertical direction is not illustrated in FIG. 1 nor in the other figures.

Due to the air gap 15, first there may be downward pressure on the touch panel 13, independent of the display 17, which is arranged fixed. The actuator 16 provides the user tactile "acknowledgement" of the actuation of the touch panel 13.

As indicated in FIG. 1, the touch panel 13 has, for example, a three-layer structure that has a tempered cover glass or a cover layer 13a, an antireflection layer 13b, and the actual touch-sensitive layer 13c, which works, for example, in a capacitive, resistive, or optical manner.

The advantage of the structure according to FIG. 1 is that the mass to be mechanically excited for the force feedback is relatively low, so that mechanical feedback on the housing and from the latter on its installation surroundings (e.g. instrument panel, center console) is relatively minor.

In order to further reduce this feedback, it is possible to excite a component of the operating unit, phase-shifted to the mechanically excited touch panel 13.

In the following, this concept of mass compensation in an operating unit with force feedback shall be explained using FIGS. 2 through 4.

Figure 2:
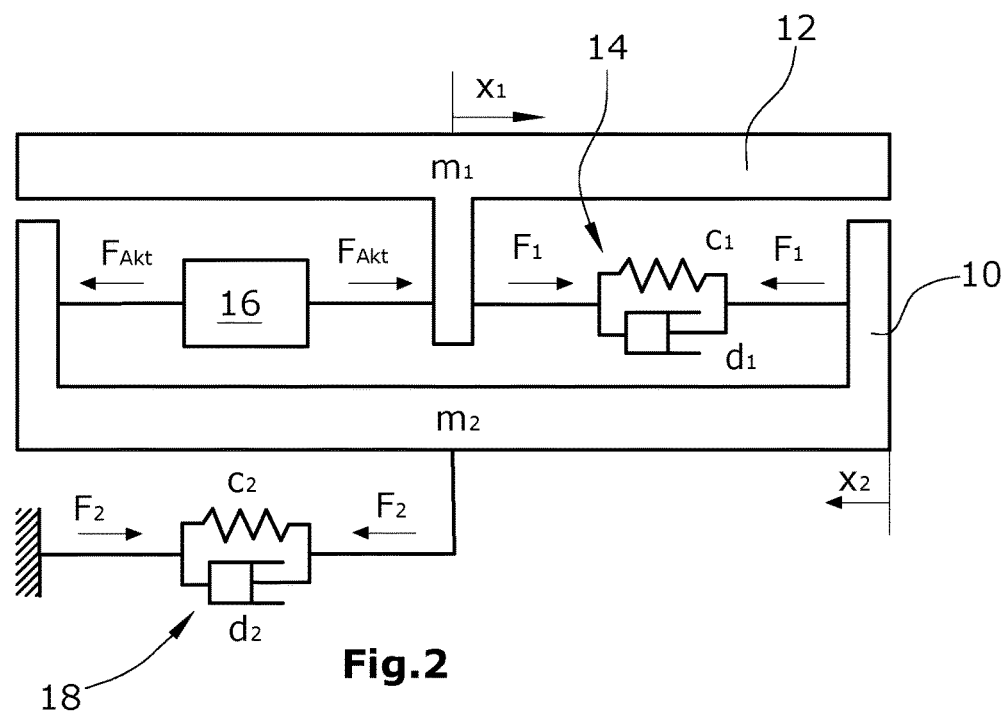
Figure 3:
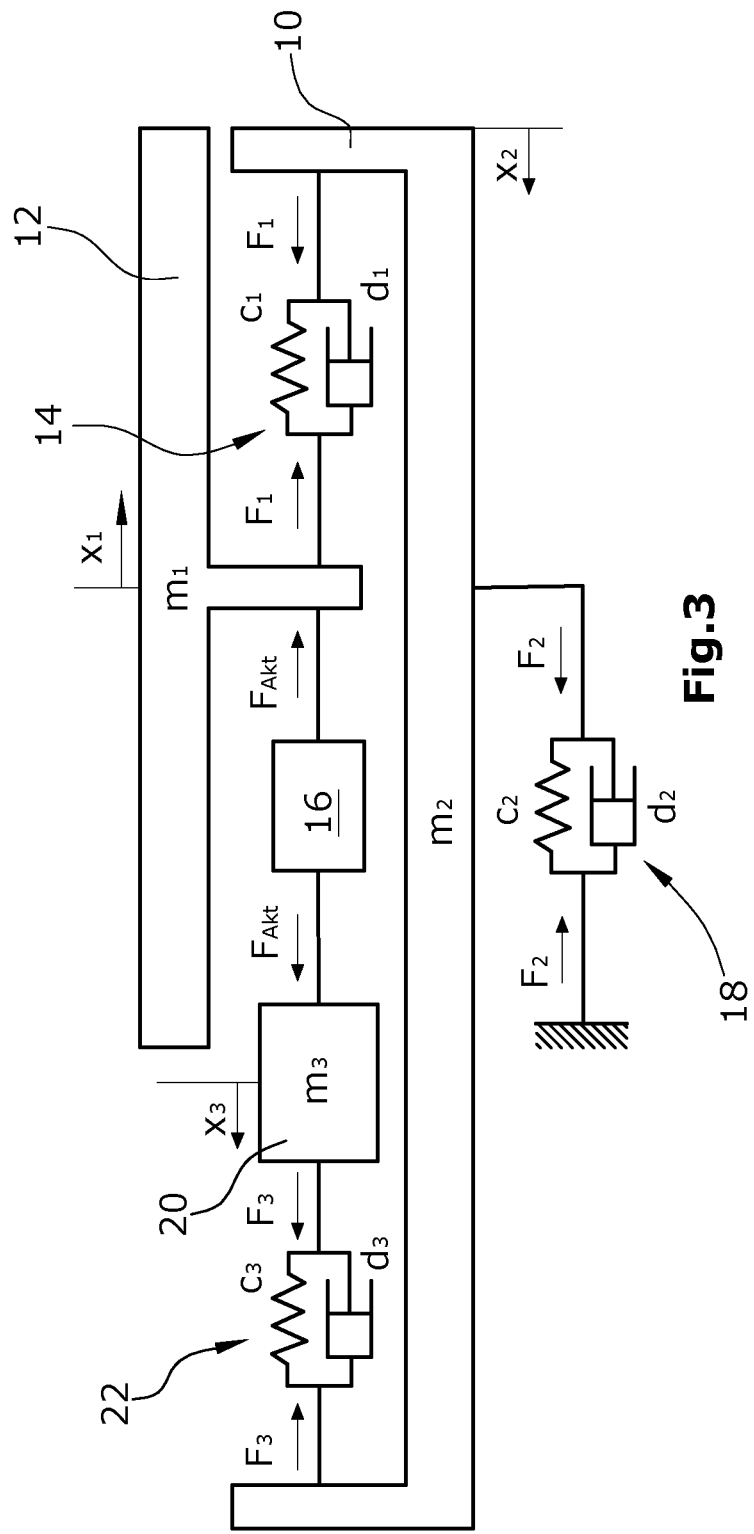

In one advantageous refinement of the invention, the use of an elastically mounted movable countermass 20 (see spring mass system 22) between the actuator 16 and the housing 10 is suggested for compensating the forces acting on the housing 10 (FIGS. 2 and 3).

Given appropriate design of the additional spring mass system 22 or $c_3$, $d_3$, $m_3$, the resulting force $F_2(t)$ acting on the vehicle may be eliminated (the static forces resulting due to gravitation do not play any role in the development of noises or vibrations).

For any given display movement $x_1(t)$, the movement $x_2(t)$/movement of the device housing and thus also the force $F_2(t)$ on the device attachment may be eliminated under the following conditions:

$$c_3 = c_1 \frac{m_3}{m_1},$$
$$d_3 = d_1 \frac{m_3}{m_1}$$

This results in the movement of the countermass 20:

$$x_3(t) = x_1(t) \frac{m_1}{m_3}$$

Under these conditions, the elasticity of the device attachment 18 also has no effect on the haptic feedback. The countermass 20 or $m_3$ as a rule is limited by the installation space and is smaller than the display mass $m_1$. Ideally it may be embodied as a part of the actuator 16.

The present invention makes it possible:
to produce haptic feedback on surfaces with mass without dynamic force acting on the surroundings,
to produce haptic feedback in an operating device that is independent of the elasticity of the device attachment.

Figure 4:
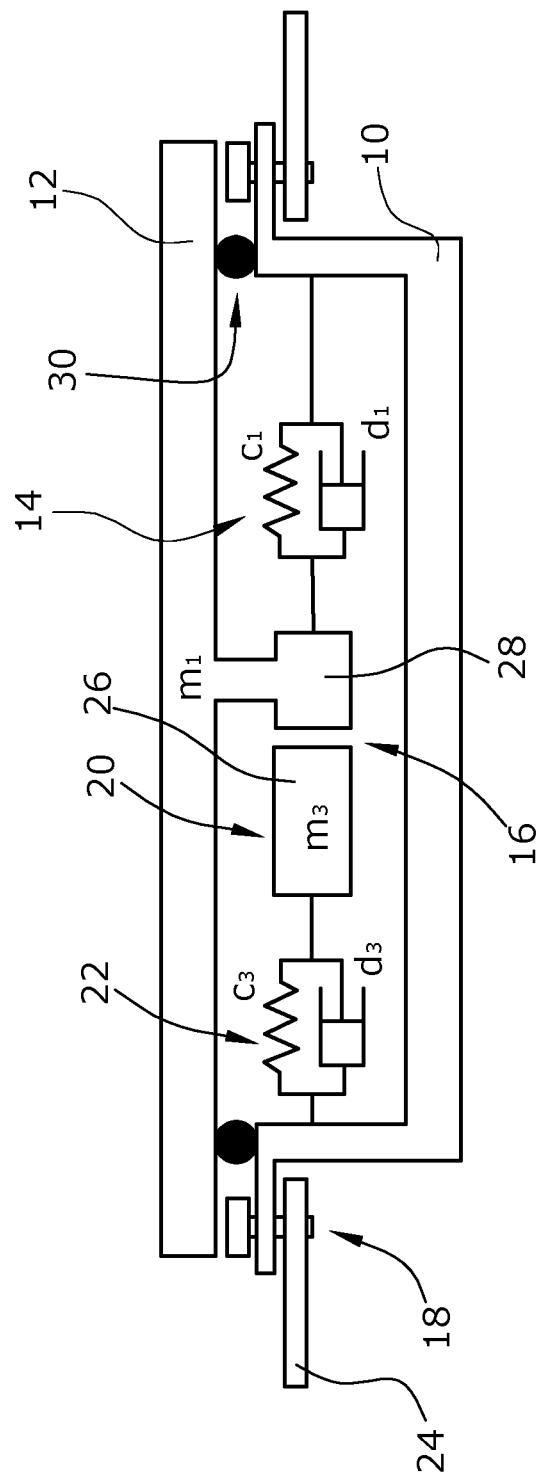

FIG. 4 illustrates a device with haptic feedback that is free of counterforce.

In the example depicted, the actuator 20 is embodied as a solenoid and has a stator sheet packet that has the actuator coil (stator 26) and that is elastically mounted on the housing 10, and an anchor sheet packet (anchor 28) securely connected to the display with control panel. The stator 26 forms the movable countermass 20. When adjusting the air gap in the solenoid, the maximum excursion of the display and the compensation weight 20 relative to one another must be taken into consideration. The stator 26 is elastically mounted (spring mass system 22) on the housing 10, but may also be elastically connected to the control panel 12, instead.

According to FIGS. 5 to 7, possible mechanical assemblies of a control panel having a display and operating element that is backlit and in which the touch panel 13 is movable shall be explained in greater detail in the following. When reference numbers used in these figures are identical to those used in FIGS. 1 to 4, they indicate structurally or functionally identical elements.

Figure 5:
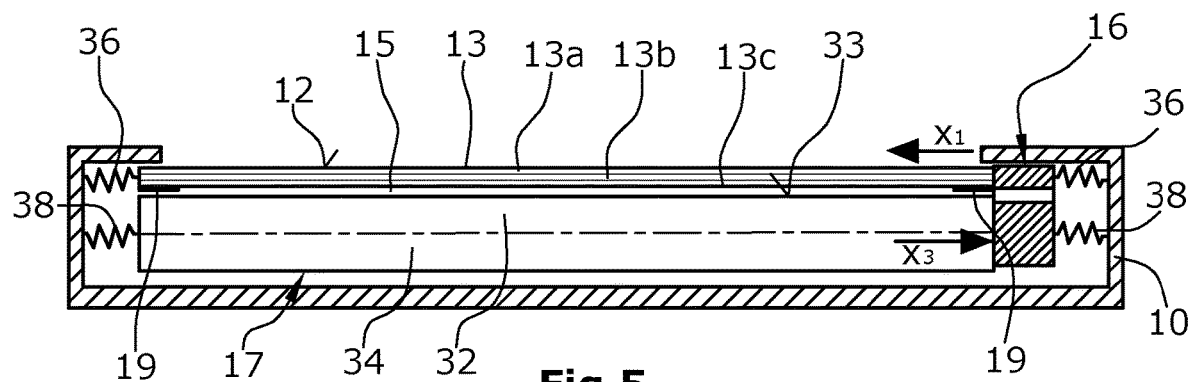
FIG. 5 is a schematic illustration of a mechanical structure for transmitting an impulse to an operator interface without resulting overall forces or overall impulses onto the mechanical holder according to another exemplary embodiment of the invention.

According to FIG. 5, after its actuation the actuator 16 produces forces that lead to the acceleration and movement of two components that are attached to it but that are separate from one another, specifically the touch panel 13 and the display 17, comprising a (e.g. LCD) display unit 32 with display surface 33 and a backlight unit 34 for the display unit 32. The movements of the touch panel 13 and display 17 are labeled $x_1$ and $x_3$. The actuator 16 is essentially characterized in that it moves the touch panel 13 and the display 17 by 180° relative to one another in a phase-shifted manner. For this, the actuator 16 may be designed, e.g., as an electromagnet, piezoelement, etc. The arrangement of the actuator 16 illustrated in FIG. 5 is one possible type of embodiment. In general integration of the actuator 16 is merely determined using the resulting initiation of the movements $x_1$ and $x_3$ by touch panel 13 and display 17, which may occur e.g. due to the arrangement of the actuator 16 below the display 17.

Figure 6:
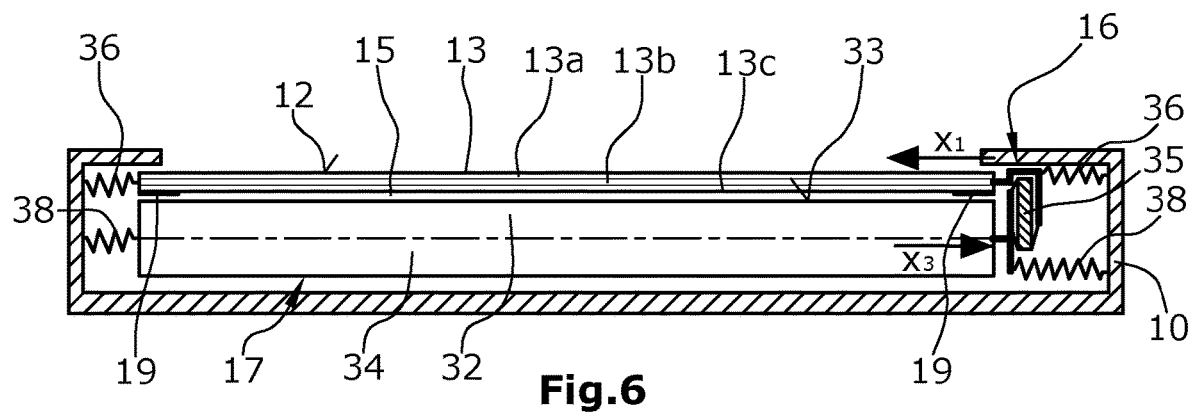
FIG. 6 is a schematic illustration of a third exemplary embodiment, but with an actuator that works piezoelectrically.

FIG. 6 illustrates an exemplary embodiment having piezoactuator 16. The actuator 16 has a piezoelectric material 35 that deforms mechanically when a voltage is applied. The touch panel 13 and the display 17 are mechanically linked to different sides of the piezoelectric material 35 of the actuator 16.

The touch panel 13 has a surface that can be touched by the user, specifically the control panel 12. The display 17 cannot be touched by the user and moreover is decoupled from the touchable surface of the touch panel 13 and of the touch panel 13 itself by the air gap 15. After the actuator 16 has been excited by means of the transfer of force, e.g. pulse, on the specific input means, i.e. for example a finger, the user perceives the feedback movement of the touch panel 13 so that there is haptic feedback following a valid interaction with the control unit, which is attained using the path sensor(s) 19.

Mechanical mounting in the housing 10 free of total pulse and total force is attained when:
The touch panel 13 moves vectorially opposite to the display 17, e.g. when the touch panel 13 moves in a positive X direction and at the same time the display 17 moves in a negative X direction, and,
The spring damping elements 36 and 38, with which the touch panel 13 and the display 17 are each elastically connected to the housing 10, are designed such that the received local pulse from the touch panel 13 and display 17 compensate one another overall.

This approach does not in general require, but also does not preclude, the following:
Equivalent mass for touch panel 13 and display 17,
Equivalent path ($x_1$,$x_3$, according to amount) for touch panel 13 and display 17, and,
Equivalence for spring damping elements 36,38.

In particular the operating element has the following structure:
Movable touch panel 13 have user surface, e.g. cover glass with bonded touch sensor layer and antireflection filter (linear or circular polarization filter) arranged therebetween,
LC cells of an LC display for an LCD display 17, having two linear polarizers, TFT and color filter glass, LC and all components of the display unit 32 relevant for its function and backlight unit 34 (backlight) for the LC display having optical diffuser coatings, LEDs, and all relevant components.

Compared to the prior art of touch screens, in which the touch panel 13 and the display 17 are not able to execute any movements relative to one another, according to the invention free movement is provided between both components. Both components satisfy their full functionality as it is known for touch screens. Furthermore, the relative movements of touch panel 13 and display 17 are so minor that no negative optical effects are detected, e.g. due to light escaping or separation of light (movements less than 1 mm). Dust and/or water are prevented from penetrating into the display by an elastic border (e.g. soft rubber coating). The elastic border furthermore prevents light from escaping from the display 17.

Compared to the prior art for haptic feedback from a device with a display element in which the entire touch screen is moved, with the invention the mass to be moved, with connection to the user surface, decreases to the weight of the touch panel 13 and, potentially, the components mechanically linked thereto. Moreover, the display 17, specifically its display unit 32 and/or its backlight unit 34, act as compensation weight 20 for the touch panel 13 and thus as the critical component for overall pulse-free design of the device as a whole. In particular no further counterweights are required for eliminating the total pulse and thus the system weight overall is reduced.

Due to the lower mass of the components connected to the user surface, either a stronger haptic feedback for the user is made possible with the same actuator 16, or the design of a smaller actuator 16 is made possible with the same perceptible feedback.

In summary, using the variant of the invention described here, haptic feedback is attained on the user interface, specifically without transferring pulse and force to the device surroundings.

Figure 7:
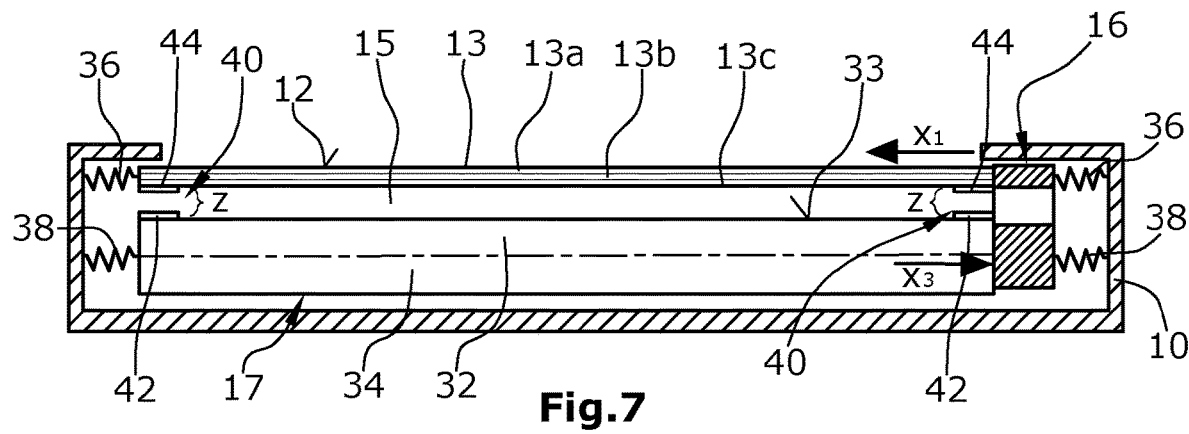
FIG. 7 is an expansion of the concept of the structure according to FIG. 5, which is expanded by a device for operating force detection (Force Sense)

FIG. 7 depicts an expansion of the concept according to FIGS. 5 and 6 with the detection of the operating force during the user's interaction with the touch panel 13 (force sense).

For detecting the operating force, a e.g. capacitive, resistive, inductor, or optical distance sensor system 40 made of e.g. a plurality of pairs of optical transmitters 42 and receivers 44 is provided. With the input from the user, a change in the relative distance z between the touch panel 13 and the display 17 occurs when the touch panel 13 of the touch screen 11 is manually actuated, so that one or a plurality of system observables of the transmitters 42 and receivers 44 may be used for detecting the change.

The distance sensor system 40 for the aforesaid special touch screen 11 is integrated, e.g. in the specific borders (frames) of the touch screen 11.

Figure 8:
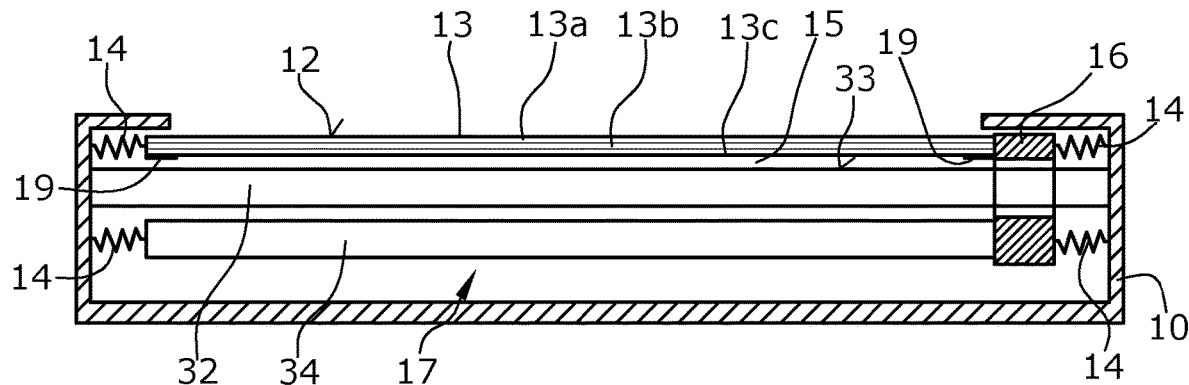
FIG. 8 illustrates a fourth exemplary embodiment of the invention, and, FIG. 9 schematically illustrates a fifth exemplary embodiment of the invention.
Figure 9:
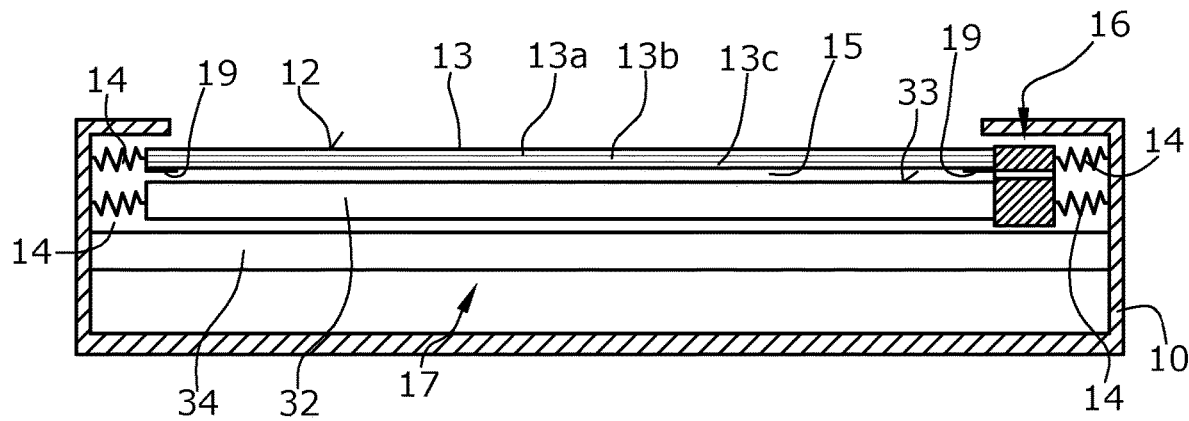

FIGS. 8 and 9 schematically depict two further exemplary embodiments of the invention. While in the exemplary embodiments according to FIGS. 5 through 7 the display 17 is used overall, that is the assembly comprising the display unit 32 and the backlight unit 34, as compensation weight 20, according to FIG. 8 only the backlight unit 34 of the display 17 is used as compensation weight 20, and according to FIG. 9 only the display unit 32 of the display 17 is used. In both cases this means that the display unit 32 and the backlight unit 34 are embodied separately from one another, that is, are not connected to one another. In each case, one of these two units is arranged fixed in the housing 10, while the other unit is arranged movable.

REFERENCE LIST

10 Housing
11 Touch screen
12 Control panel
13 Touch panel
13a Cover layer of the touch panel
13b Anti-reflection layer of the touch panel
13c Touch-sensitive layer of the touch panel
14 Elastic connection of control panel to housing
15 Air gap
16 Actuator
17 Display
18 Connection of housing to vehicle
19 Path sensor
20 Compensation weight
22 Elastic connection of compensation weight to housing and/or control panel
24 Vehicle or vehicle instrument panel
26 Stator of solenoid embodied as actuator
28 Anchor of solenoid
30 Control panel guidance for movement during haptic feedback
32 Display unit
33 Display surface
34 Backlight unit
35 Piezoelectric material
36 Spring damping element
38 Spring damping element
40 Distance sensor system
42 Transmitter of distance sensor system
44 Receiver of distance sensor system
$m_1$ Mass of control panel
$x_1(t)$ Excursion of control panel
$F_{Akt}(t)$ Actuator force curve
$F_1(t)$ Force of the control panel acting on the housing upon excitation of the control panel ($F_1(t)=F_{Akt}-m_1 \times a_1$)
$c_1$ Spring constant of the elastic connection of the control panel on the housing
$d_1$ Damping of elastic connection of the control panel on the housing
$m_2$ Mass of the housing
$x_2(t)$ Excursion of the housing due to the force exerted by the mechanically excited control panel
$F_2(t)$ Force acting on the housing attachment
$m_3$ Mass of the compensation weight
$x_3(t)$ Excursion of the compensation weight
$F_3$ Force acting on the housing due to the compensation weight
$c_3$ Spring constant of the elastic connection of the compensation weight on the housing
$d_3$ Damping of the elastic connection of the compensation weight on the housing
z Distance between display unit and backlight unit

The invention claimed is:

1. An operating unit for a device, the operating unit being provided with
    a housing that has a control panel and that is provided for attaching in an apparatus,
    wherein the control panel is mounted elastically at and/or in the housing,
    at least one actuator for mechanically exciting the control panel upon detection of an operation of the control panel, and,
    a display unit having a display surface,
    the control panel forming the front side of a touch-sensitive touch panel for spatially resolved detection of a touch of the control panel,
    wherein the touch panel is arranged separated from the display unit, and,
    wherein the at least one actuator mechanically excites the touch panel when touching of the control panel is detected,
    wherein
        a compensation weight is elastically mounted in and/or at the housing and/or is elastically mounted at the touch panel, wherein the compensation weight is mechanically excitable by the actuator or by an actuator for compensating the forces acting on the housing when the touch panel is mechanically excited,
    wherein at least one of
    the display unit forms the compensation weight and
    the display unit has a backlight unit for backlighting the display unit, wherein the backlight unit is arranged separated from the display unit and forms the compensation weight.

2. The operating unit according to claim 1, wherein the compensation weight is excitable vectorially opposite to the touch panel.

3. The operating unit according to claim 1, wherein the movement strokes of the touch panel and of the compensation weight when excited by the actuator(s) are designed/determined as a function of at least one of the ratio of the specific masses of the touch panel and the compensation weight, the relationship between the position of the centers of mass of the touch panel and the compensation weight, the spring damping elements of the specific elastic bearings of the touch panel and the compensation weight at the housing, and the size of the mutual vectorially opposed movement stroke components or movement strokes of the touch panel and the compensation weight.

4. The operating unit according to claim 1, wherein a common actuator for mechanical excitation of both the touch panel and the compensation weight is provided, wherein the actuator has an actuator element, the length of which is variable and which has two ends facing away from one another, the distance between the ends being variable by opposing movement, and of which the one end is mechanically linked to the touch panel and the other end is mechanically linked to the compensation weight for the purpose of mechanically exciting the touch panel and the compensation weight.

5. The operating unit according to claim 1, wherein a path sensor for detecting an actuation movement of the control panel when a manual pressure is exerted on the touch panel.

6. The operating unit according to claim 1, wherein the touch panel has a protective layer and a sensor layer, and has a light-permeable antireflection layer therebetween, these being bonded to one another.

7. The operating unit according to claim 1, wherein the housing is configured for attachment in a vehicle dashboard or vehicle center console.

8. The operating unit according to claim 1, wherein the display unit forms the compensation weight.

9. The operating unit according to claim 1, wherein the display unit has a backlight unit for backlighting the display unit, and wherein the backlight unit is arranged separated from the display unit and forms the compensation weight.

10. The operating unit according to claim 3, wherein the movement strokes of the touch panel and of the compensation weight when excited by the actuator(s) are designed/determined as a function of the ratio of the specific masses of the touch panel and the compensation weight.

11. The operating unit according to claim 3, wherein the movement strokes of the touch panel and of the compensation weight when excited by the actuator(s) are designed/determined as a function of relationship between the position of the centers of mass of the touch panel and the compensation weight.

12. The operating unit according to claim 3, wherein the movement strokes of the touch panel and of the compensation weight when excited by the actuator(s) are designed/determined as a function of the spring damping elements of the specific elastic bearings of the touch panel and the compensation weight at the housing.

13. The operating unit according to claim 3, wherein the movement strokes of the touch panel and of the compensation weight when excited by the actuator(s) are designed/determined as a function of the size of the mutual vectorially opposed movement stroke components or movement strokes of the touch panel and the compensation weight.

14. The operating unit according to claim 1, wherein the actuator has a piezoceramic element.

15. The operating unit according to claim 1, wherein the touch panel has a proximity and/or touch sensor system that works in a resistive, capacitive, or optical manner.

16. The operating unit according to claim 15, wherein the touch panel has a proximity and/or touch sensor system that works in an optical manner.

17. The operating unit according to claim 16, wherein proximity and/or touch sensor system functions as a polarization filter.

* * * * *